United States Patent
Masazumi et al.

(10) Patent No.: US 9,795,002 B2
(45) Date of Patent: Oct. 17, 2017

(54) ILLUMINATION APPARATUS AND LIGHT EMITTING MODULE

(71) Applicant: KONICA MINOLTA, INC., Tokyo (JP)

(72) Inventors: Naoki Masazumi, Kobe (JP); Nobuya Miki, Ibaraki (JP); Yasuhiro Honda, Ibaraki (JP); Junya Wakahara, Settsu (JP)

(73) Assignee: KONICA MINOLTA, INC., Tokyo (JP)

(*) Notice: Subject to any disclaimer, the term of this patent is extended or adjusted under 35 U.S.C. 154(b) by 0 days.

(21) Appl. No.: 14/359,391

(22) PCT Filed: Oct. 17, 2012

(86) PCT No.: PCT/JP2012/076816
§ 371 (c)(1),
(2) Date: May 20, 2014

(87) PCT Pub. No.: WO2013/080689
PCT Pub. Date: Jun. 6, 2013

(65) Prior Publication Data
US 2014/0327359 A1   Nov. 6, 2014

(30) Foreign Application Priority Data
Nov. 28, 2011   (JP) ................... 2011-258571

(51) Int. Cl.
*H05B 37/00* (2006.01)
*G01R 31/00* (2006.01)
(Continued)

(52) U.S. Cl.
CPC ..... *H05B 33/0896* (2013.01); *H01L 27/3204* (2013.01); *H05B 33/0824* (2013.01);
(Continued)

(58) Field of Classification Search
CPC .................................. H05B 33/0896
(Continued)

(56) References Cited

U.S. PATENT DOCUMENTS 3,719,859 A * 3/1973 Frantz et al. .......... 361/92
4,074,170 A * 2/1978 Orban .......... 315/120
(Continued)

FOREIGN PATENT DOCUMENTS

| JP | 2006-103404 A | 4/2006 |
|----|---------------|--------|
| JP | 2006-210272 A | 8/2006 |

(Continued)

OTHER PUBLICATIONS

International Search Report for International Application No. PCT/JP2012/076816, mailed Jan. 8, 2013, with English translation.
(Continued)

*Primary Examiner* — Douglas W Owens
*Assistant Examiner* — Wei Chan
(74) *Attorney, Agent, or Firm* — Cantor Colburn LLP

(57) ABSTRACT

An illumination apparatus includes: a plurality of light emitting modules connected in series; a constant current source; and a fault detection circuit for detecting that the plurality of light emitting modules have at least one thereof with a short circuit fault. The light emitting module includes: an organic EL panel; a threshold value detection circuit configured to output a constant voltage when the organic EL panel between its anode and cathode has a potential difference equal to or larger than a threshold value; and a VI conversion circuit receiving the constant voltage from the threshold value detection circuit, converting the constant voltage into a constant current, and outputting the constant current. The fault detection circuit detects whether the (Continued)

plurality of light emitting modules have a short circuit fault based on a total value of the constant current output from each light emitting module.

2 Claims, 8 Drawing Sheets

(51) Int. Cl.
G06F 19/00 (2011.01)
H05B 37/02 (2006.01)
H05B 33/08 (2006.01)
H01L 27/32 (2006.01)
G01R 31/02 (2006.01)
G01R 31/26 (2014.01)
G01R 31/44 (2006.01)

(52) U.S. Cl.
CPC ....... *H05B 33/0893* (2013.01); *G01R 31/025* (2013.01); *G01R 31/2635* (2013.01); *G01R 31/44* (2013.01); *H01L 2251/5361* (2013.01); *Y02B 20/383* (2013.01)

(58) Field of Classification Search
USPC ....... 315/121–122, 193, 185 R, 201; 353/85; 702/58; 324/414
See application file for complete search history.

(56) References Cited

U.S. PATENT DOCUMENTS

| | | | | |
|---|---|---|---|---|
| 4,308,848 A | * | 1/1982 | Pfaff et al. | 123/618 |
| 4,420,804 A | * | 12/1983 | Nishino | 363/21.04 |
| 4,617,496 A | * | 10/1986 | Samodovitz | 315/208 |
| 5,451,845 A | * | 9/1995 | Ribarich | 315/225 |
| 6,330,101 B1 | * | 12/2001 | Yamamoto et al. | 359/267 |
| 6,600,274 B1 | * | 7/2003 | Hughes | H05B 33/0812 315/291 |
| 6,952,334 B2 | * | 10/2005 | Ball et al. | 361/93.9 |
| 8,405,318 B2 | * | 3/2013 | Hatakenaka | H01L 25/167 315/291 |
| 8,912,725 B2 | * | 12/2014 | Ye | 315/158 |
| 2002/0043943 A1 | * | 4/2002 | Menzer et al. | 315/291 |
| 2005/0179629 A1 | * | 8/2005 | Inoue | 345/82 |
| 2005/0206325 A1 | * | 9/2005 | Wakou | H05B 33/08 315/224 |
| 2006/0076905 A1 | * | 4/2006 | Inagaki | H05B 33/0812 315/291 |
| 2007/0236962 A1 | * | 10/2007 | Minkkinen | H02M 1/32 363/16 |
| 2009/0160349 A1 | * | 6/2009 | Weger | 315/246 |
| 2009/0212721 A1 | * | 8/2009 | Maruyama | H05B 33/0815 315/307 |
| 2010/0049454 A1 | * | 2/2010 | Irissou | H05B 33/0893 702/58 |
| 2010/0123399 A1 | * | 5/2010 | Bollmann et al. | 315/122 |
| 2010/0295460 A1 | * | 11/2010 | Lin et al. | 315/193 |
| 2011/0006689 A1 | * | 1/2011 | Blanchard | H05B 33/0824 315/121 |
| 2011/0068706 A1 | * | 3/2011 | Otake | H05B 33/0815 315/291 |
| 2011/0199003 A1 | * | 8/2011 | Muguruma | H05B 33/083 315/122 |
| 2011/0273102 A1 | * | 11/2011 | van de Ven et al. | 315/193 |
| 2012/0229030 A1 | * | 9/2012 | Moskowitz | H05B 33/0809 315/122 |
| 2012/0248986 A1 | * | 10/2012 | Gibbs | 315/122 |
| 2013/0320857 A1 | * | 12/2013 | Fu et al. | 315/122 |
| 2014/0247432 A1 | * | 9/2014 | Yanase | 353/85 |
| 2014/0300274 A1 | * | 10/2014 | Acatrinei | 315/85 |

FOREIGN PATENT DOCUMENTS

| | | |
|---|---|---|
| JP | 2009-38247 A | 2/2009 |
| JP | 2010-272410 A | 12/2010 |
| JP | 2011-82108 A | 4/2011 |
| JP | 2011-204625 A | 10/2011 |

OTHER PUBLICATIONS

Extended European Search Report corresponding to Application No. 12852557.3-1903/2787793, PCT/JP2012/076816; Date of Mailing: Jun. 16, 2015.

* cited by examiner

ILLUMINATION APPARATUS AND LIGHT EMITTING MODULE

This is the U.S. national stage of application No. PCT/JP2012/076816, filed on 17 Oct. 2012. Priority under 35 U.S.C. §119(a) and 35 U.S.C. §365(b) is claimed from Japanese Application No. 2011-258571, filed 28 Nov. 2011, the disclosure of which is also incorporated herein by reference.

TECHNICAL FIELD

The present invention relates to an illumination apparatus and a light emitting module, and more specifically to a technique employed to detect a short circuit fault caused in an illumination apparatus configured of a plurality of light emitting modules connected in series.

BACKGROUND ART

Conventionally, illumination apparatuses with a light emitting diode (LED) used as a light source have been prevalently used. For example, Japanese Patent Laying-Open No. 2006-210272 (PTD 1) discloses an illumination apparatus including an LED light source and an LED drive device that turns on the LED light source. PTD 1 describes the illumination apparatus with the LED light source formed of a plurality of LEDs connected in series. The LED light source receives a current controlled to be constant to hold each LED constant in brightness.

Furthermore, in recent years, a number of illumination apparatuses with an organic electroluminescence (EL) panel used as a light source have been proposed. The organic EL panel is a surface emitting device, and accordingly, an illumination apparatus having an organic EL panel with a light emitting surface having a larger area can emit light in a larger amount. Increasing the organic EL panel's substrate in size, however, may result in a production apparatus increased in size, poor yields and other disadvantages. Accordingly, a plurality of organic EL panels of a size allowing the panels to be easily produced are aligned to provide a light emitting surface increased in size. This configuration, as well as the illumination apparatus using the LED light source as described above, has a plurality of organic EL panels connected in series and receiving a prescribed current to ensure constant brightness.

When an illumination apparatus formed of a plurality of light emitting devices connected in series has any light emitting device with a short circuit fault, the portion having the short circuit fault may locally generate heat and thus damage the illumination apparatus. Accordingly, the short circuit fault of the light emitting device must be detected and driving the plurality of light emitting devices must be stopped.

Whether a plurality of light emitting devices have a short circuit fault is detected in the illumination apparatus of PTD 1 via a configuration including a voltage detection unit to detect voltage for each LED group formed of three series-connected ones of the LEDs, and a fault detection unit to detect, based on a value in voltage detected by the voltage detection unit, whether the LED light source is faulty. The fault detection unit calculates each LED group's forward voltage based on the voltage detected by each voltage detection unit. The forward voltage is then compared with a fault detection threshold value, and when the forward voltage is below the threshold value, the fault detection unit determines that the LED group of interest has at least one LED with a short circuit fault.

CITATION LIST

Patent Document

PTD 1: Japanese Patent Laying-Open No. 2006-210272

SUMMARY OF INVENTION

Technical Problem

The configuration described in PTD 1, however, requires configuring each LED group of a limited number of LEDs to ensure detection precision. This is based on the fact that even when a current of a single value is applied, individual LEDs despite that vary in forward voltage.

More specifically, if the LED varies in forward voltage within a range of VL to VH with a potential difference $\Delta V=VH-VL$, and an LED group of n LEDs connected in series does not have any LED with a short circuit fault, n being larger than 1, then the LED group will have a forward voltage VB having a value falling within a range larger than n×VL and smaller than n×VH, i.e., n×VL<VB<n×VH. In contrast, when at least one LED has a short circuit fault, forward voltage VB will have a maximum value of (n−1)×VH. Accordingly, comparing forward voltage VB with a fault detection threshold value VS and therefrom detecting with precision whether there is any LED having a short circuit fault, requires setting threshold value VS to be larger than (n−1)×VH and smaller than n×VL, i.e., (n−1)×VH<VS<n×VL. This in turn requires satisfying (n−1)×VH<n×VL, and as a result, the LED group will be configured of n LEDs, n having a maximum value limited to be smaller than VH/dV, i.e., n<VH/dV.

Thus if the LED group's forward voltage is compared with a threshold value and therefrom whether there is any LED having a short circuit fault is detected, the LED group is configured of a limited number of LEDs as the LEDs vary in forward voltage. As such, as an illumination apparatus increases in size and accordingly has an increasing number of LED groups, the illumination apparatus will have an increasing number of wirings to connect the LED groups to the fault detection unit and hence a complicated circuit configuration.

The present invention has been made to address such an issue, and the present invention contemplates allowing a simple circuit configuration to be used to detect with precision a short circuit fault caused in an illumination apparatus formed of a plurality of light emitting devices connected in series.

Solution to Problem

The present invention in one aspect provides an illumination apparatus including: a plurality of light emitting modules connected in series; a constant current source for supplying a current to the plurality of light emitting modules; and a fault detection circuit for detecting that the plurality of light emitting modules have at least one thereof with a short circuit fault. The plurality of light emitting modules each include: a light emitting device emitting light depending on a current supplied; a threshold value detection circuit configured to output a constant voltage when the light emitting device between an anode thereof and a cathode thereof has a potential difference equal to or larger than a threshold value; and a voltage/current conversion circuit receiving the constant voltage from the threshold value detection circuit, converting the constant voltage into a constant current, and outputting the constant current. The fault detection circuit detects whether the plurality of light emitting modules have a short circuit fault based on a total value of the constant current output from each light emitting module.

Advantageous Effect of Invention

The present invention thus allows a simple circuit configuration to be used to detect with precision a short circuit fault caused in an illumination apparatus formed of a plurality of light emitting devices connected in series.

DESCRIPTION OF EMBODIMENTS

Hereinafter reference will be made to the drawings to describe the present invention in embodiments. In the figures, identical or corresponding components are identically denoted and will not be described repeatedly.

First Embodiment

Figure 1:
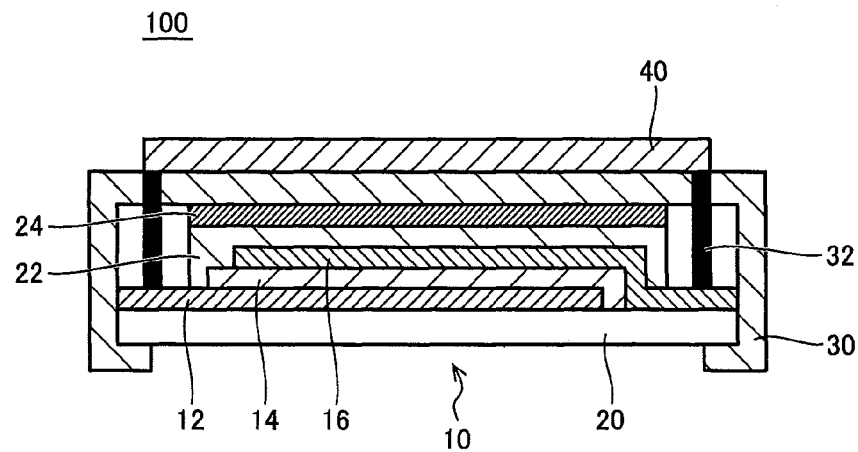
FIG. 1 is a cross section of a light emitting module applied to an illumination apparatus according to a first embodiment of the present invention.

FIG. 1 is a cross section of a light emitting module 100 applied to an illumination apparatus according to a first embodiment of the present invention.

With reference to FIG. 1, light emitting module 100 includes a light emitting device implemented as an organic electroluminescence (EL) panel 10, a casing 30 for holding organic EL panel 10, and a circuit board 40 having a power feeding unit and the like mounted thereon for feeding organic EL panel 10 with electric power.

Organic EL panel 10 includes a transparent substrate 20, a positive electrode (or anode) 12, an organic layer 14, a negative electrode (or cathode) 16, a sealing substrate 22, and an adhesive layer 24. Positive electrode 12, organic layer 14, and negative electrode 16 are successively deposited in layers on transparent substrate 20. Sealing substrate 22 is provided to cover positive electrode 12, organic layer 14, and negative electrode 16.

Transparent substrate 20 configures a surface serving as a light emitting surface and is represented by a glass substrate. Alternatively, transparent substrate 20 may be a transparent resin substrate formed of polyethylene terephthalate (PET), polyether sulfone (PES), polycarbonate (PC), or the like.

Positive electrode 12 is a transparent, electrically conductive film. Positive electrode 12 is deposited as follows: Sputtering or the like is employed to deposit indium tin oxide (ITO) or the like on transparent substrate 20. Then, photolithography or the like is employed to pattern the ITO film, as prescribed, to provide positive electrode 12.

Organic layer 14 generates light (visible light) when the layer receives electric power. Organic layer 14 may be a single light emitting layer or may be configured of a hole transporting layer, a light emitting layer, a hole blocking layer, an electron transporting layer, and the like deposited successively.

Negative electrode 16 is aluminum for example. Negative electrode 16 is formed through vacuum deposition or the like to cover organic layer 14. To pattern negative electrode 16, as prescribed, vacuum deposition may be done using a mask.

Sealing substrate 22 is insulative. Sealing substrate 22 is provided to protect organic layer 14 from moisture and the like. Sealing substrate 22 has a surface, at which organic EL panel 10 has a back surface. Sealing substrate 22 is for example a glass substrate bonded around it via an epoxy, photo-curing adhesive layer 24.

When voltage (forward voltage) is applied to organic EL panel 10 from positive electrode 12 towards negative electrode 16, holes are injected from positive electrode 12 into organic layer 14 and electrons are injected from negative electrode 16 into organic layer 14, and organic layer 14 has a luminous body thereof excited to emit light. Organic layer 14 thus generates light, which is in turn extracted externally through transparent substrate 20 (or a front surface).

Organic EL panel 10 has a back surface provided with circuit board 40. Circuit board 40 is provided with a power supply terminal (not shown) for applying voltage between positive electrode 12 and negative electrode 16. Positive electrode 12 and negative electrode 16 are drawn out of sealing substrate 22, and these drawn portions are electrically connected to the power supply terminal via a connecting electrode 32.

Furthermore, circuit board 40 is provided with a circuit for detecting a short circuit fault caused in organic EL panel 10, as will be described hereinafter with reference to FIG. 2.

Figure 2:
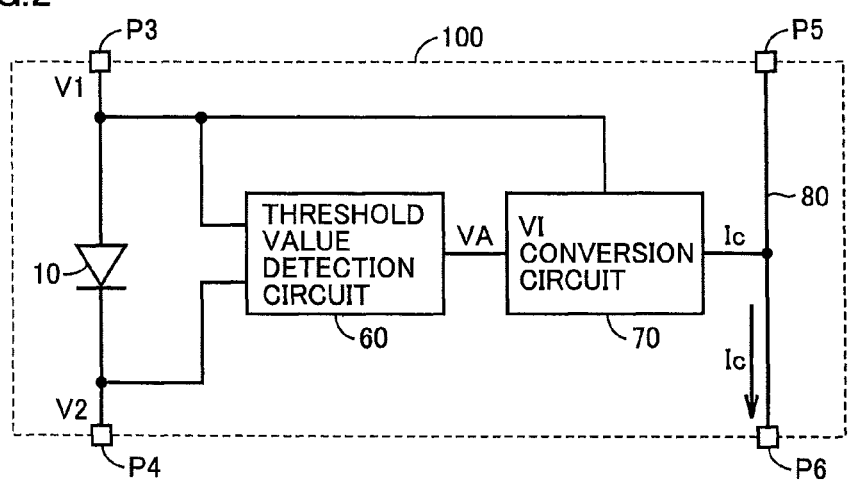
FIG. 2 schematically shows a configuration of a light emitting module according to the first embodiment of the present invention.

FIG. 2 schematically shows a configuration of light emitting module 100 according to the first embodiment of the present invention.

With reference to FIG. 2, light emitting module 100 includes organic EL panel 10, a threshold value detection circuit 60, and a VI conversion circuit 70. Threshold value detection circuit 60 and VI conversion circuit 70 configure a current generation circuit to generate a current corresponding to a state (a normal state or a faulty state) of organic EL panel 10.

Threshold value detection circuit 60 is connected to organic EL panel 10 between the positive and negative electrodes. When organic EL panel 10 is emitting light, and organic EL panel 10 at the positive electrode has a voltage V1 and at the negative electrode has a voltage V2, a forward voltage Vf=V1−V2 is developed between the positive electrode and the negative electrode.

Threshold value detection circuit 60 includes a circuit to generate a threshold value Vth for forward voltage Vf of organic EL panel 10. Threshold value detection circuit 60 compares forward voltage Vf with threshold value Vth and outputs a resultant comparison as voltage VA. More specifically, if organic EL panel 10 has forward voltage Vf exceeding threshold value Vth, i.e., Vf>Vth, threshold value detection circuit 60 outputs voltage VA equal to a difference in voltage between the positive electrode's voltage V1 and threshold value Vth, i.e., VA=V1−Vth. In contrast, if forward voltage Vf is equal to or smaller than threshold value Vth, i.e., Vf≤Vth, threshold value detection circuit 60 outputs voltage VA=0. Accordingly, when organic EL panel 10 has a short circuit fault, forward voltage Vf will equal zero, and accordingly, threshold value detection circuit 60 outputs voltage VA=0.

Note that forward voltage Vf varies with the value of a current supplied to organic EL panel 10, the temperature of organic EL panel 10, how organic EL panel 10 is degraded, and the like. Accordingly, forward voltage Vf has a voltage range (for example of 3 V to 5 V for the sake of illustration). Accordingly, whether organic EL panel 10 has a short circuit fault can be determined with threshold value detection circuit 60 simply having threshold value Vth set to be smaller than this voltage range (e.g., 0 V<Vth<3 V).

Thus when organic EL panel 10 does not have a short circuit fault, that is, when it has the normal state, threshold value detection circuit 60 outputs a constant voltage (VA=V1−Vth). In contrast, when organic EL panel 10 has a short circuit fault, i.e., a faulty state, threshold value detection circuit 60 outputs voltage VA=0.

VI conversion circuit 70 is powered by voltage V1 of the positive electrode of organic EL panel 10 and receives voltage VA from threshold value detection circuit 60 as an input thereto. VI conversion circuit 70 converts voltage VA into a current Ic and outputs it. Specifically, when VI conversion circuit 70 receives the constant voltage (VA=V1−Vth), VI conversion circuit 70 converts the constant voltage into constant current Ic=Ic1 and outputs it. In contrast, when VI conversion circuit 70 receives voltage VA=0, VI conversion circuit 70 converts the voltage of zero into current Ic=0 and outputs it.

VI conversion circuit 70 thus outputs current Ic which can in turn be externally output from light emitting module 100 via a current outputting terminal (hereinafter also simply referred to as a "current terminal") P6 of a plurality of terminals P3-P6 provided at circuit board 40 (see FIG. 1). Note that terminals P3 and P4 are connected to the organic EL panel 10 positive and negative electrodes, respectively, and configure a power supply terminal for applying forward voltage to organic EL panel 10. Furthermore, when a plurality of light emitting modules 100 are connected in series (see FIG. 3), terminal P5 is connected to current terminal P6 of light emitting module 100 adjacent thereto to serve as a terminal to receive current Ic from light emitting module 100 adjacent thereto via current terminal P6. Between current terminal P5 and current terminal P6, a current carrying wire 80 is disposed for passing current Ic.

Thus the present invention in the first embodiment provides light emitting module 100 configured such that when organic EL panel 10 has a normal state, constant current Ic=Ic1 is output, whereas when organic EL panel 10 has a short circuit fault, current Ic=0 is output. Current Ic can be detected to determine whether organic EL panel 10 has a short circuit fault.

Figure 3:
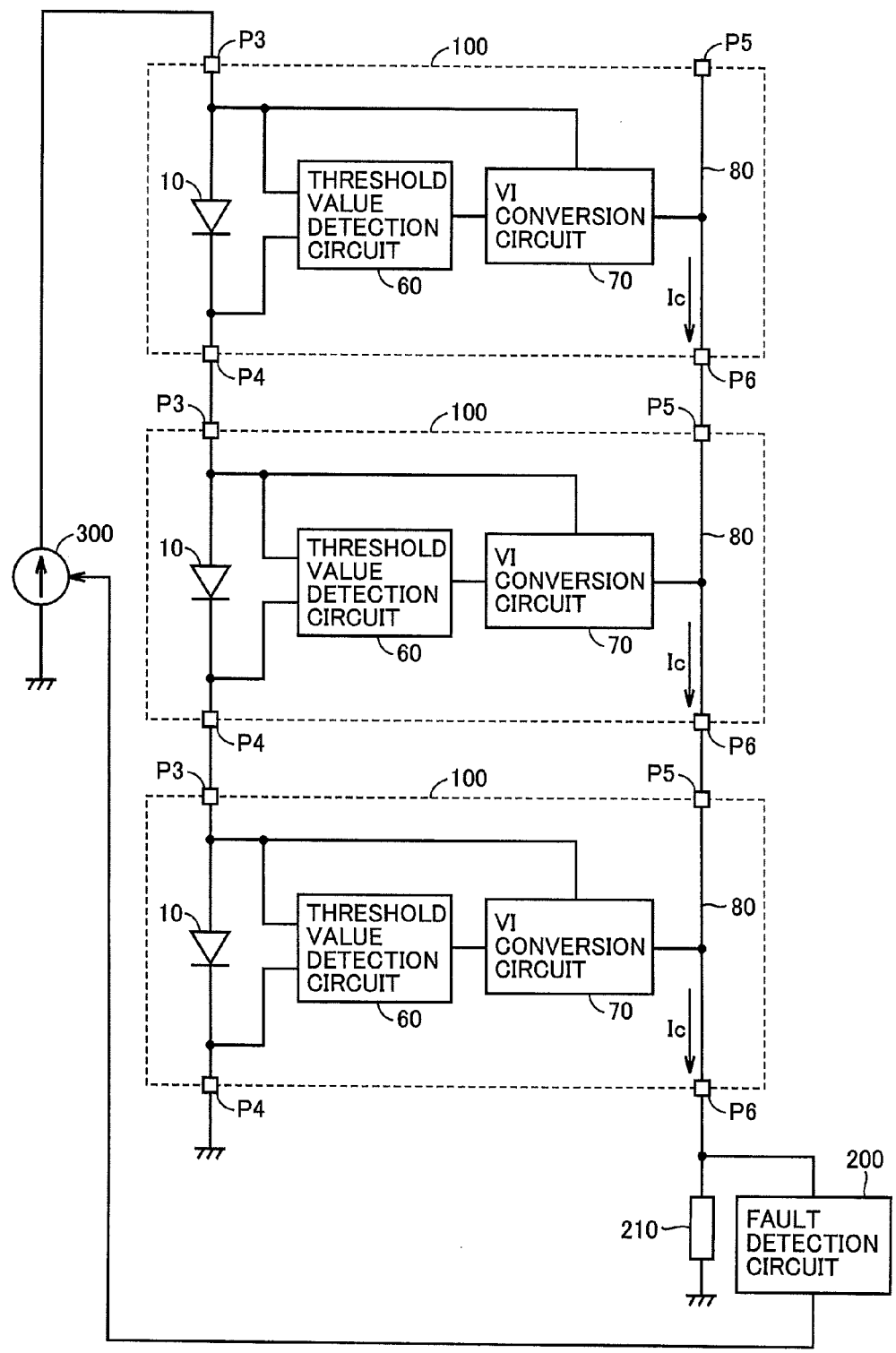
FIG. 3 schematically shows a configuration of an illumination apparatus configured using the light emitting module shown in FIG. 2.

FIG. 3 schematically shows a configuration of an illumination apparatus configured with light emitting module 100 shown in FIG. 2.

With reference to FIG. 3, the illumination apparatus includes a plurality of light emitting modules 100 connected in series, a constant current source 300, a fault detection circuit 200, and a detection resistance 210. FIG. 3 shows by way of example the illumination apparatus including three light emitting modules 100. Note that light emitting modules 100 are not limited in number to three. Two or more light emitting modules 100 may be mounted depending on what level in brightness the illumination apparatus is required to provide.

The plurality of light emitting modules 100 are connected in series by each having power supply terminal P3 wired to power supply terminal P4 of an adjacent light emitting module 100. FIG. 3 shows an uppermost light emitting module 100 having power supply terminal P3 connected to constant current source 300. FIG. 3 shows a lowermost light emitting module 100 having power supply terminal P4 connected to a ground voltage. Thus constant current source 300 supplies a constant current which is in turn passes through the plurality of light emitting modules 100 toward the ground voltage. In each light emitting module 100 organic EL panel 10 receives a current and thus emits light.

Furthermore, the plurality of light emitting modules 100 each have current terminal P6 wired to current terminal P5 of an adjacent light emitting module 100. FIG. 3 shows detection resistance 210 connected between current terminal P6 of the lowermost light emitting module 100 and a ground voltage.

Fault detection circuit 200 detects voltage developed in detection resistance 210. Fault detection circuit 200 determines from the detected voltage whether any of the plurality of light emitting modules 100 has a short circuit fault. If so, fault detection circuit 200 generates a control signal for stopping a current supplied from constant current source 300 and outputs the control signal to constant current source 300.

Note that, as has been described with reference to FIG. 2, light emitting module 100 outputs constant current Ic=Ic1 when organic EL panel 10 incorporated therein has the normal state. Accordingly, when three organic EL panels 10 shown in FIG. 3 all normally operate, the lowermost light emitting module 100 outputs at current terminal P6 a current that is a total of constant current Ic=Ic1 output from each light emitting module 100, i.e., 3×Ic1. This output current of 3×Ic1 passes through detection resistance 210 and develops a potential difference of 3×Ic1×R across detection resistance 210. Note that R represents a value in resistance of detection resistance 210. Fault detection circuit 200 detects the potential difference developed in detection resistance 210. In the FIG. 3 example, if fault detection circuit 200 detects a potential difference of 3×Ic1×R, fault detection circuit 200 determines that the three light emitting modules 100 have their respective organic EL panels 10 all in the normal state.

In contrast, if any of three light emitting modules 100 has a short circuit fault, then light emitting module 100 including organic EL panel 10 having the short circuit fault outputs current Ic=0. Accordingly in FIG. 3, the lowermost light emitting module 100 outputs at current terminal P6 a current that is a total of constant currents Ic=Ic1 output from the other, two normal light emitting modules 100, i.e., 2×Ic1.

Detection resistance 210 develops a potential difference of $2 \times Ic1 \times R$. Fault detection circuit 200 determines from the detected potential difference of $2 \times Ic1 \times R$ that one of the three light emitting modules 100 is faulty. In that case, fault detection circuit 200 controls constant current source 300 to stop it from supplying the current.

Thus the plurality of light emitting modules 100 output currents Ic, respectively, which are in turn summed together and converted by detection resistance 210 into a voltage, and therefrom fault detection circuit 200 determines whether the plurality of light emitting modules 100 have at least one thereof with a fault. For example, if the illumination apparatus is configured of n light emitting modules 100, n being a natural number equal to or larger than two, then, fault detection circuit 200 sets a value of $n \times Ic1 \times R$ as a reference for determining whether n light emitting modules 100 have at least one thereof with a fault. Then, if detection resistance 210 develops a potential difference below the reference value of $n \times Ic1 \times R$, fault detection circuit 200 determines that n light emitting modules 100 have at least one thereof with a fault.

Note that when one of n light emitting modules 100 is faulty, detection resistance 210 will develop a potential difference of $(n-1) \times Ic1 \times R$. In other words, with n light emitting modules 100 having one faulty light emitting module 100, detection resistance 210 develops a potential difference reduced by $Ic1 \times R$. This voltage drop of $Ic1 \times R$ can accurately be detected via fault detection circuit 200 simply having a dynamic range set at n:1. For example, if fault detection circuit 200 is an 8-bit analog to digital (AD) converter, n will equal 256, and it is applicable to an illumination apparatus configured of 256 light emitting modules 100.

A conventional illumination apparatus requires limiting the number of light emitting modules connectable in series in view of avoiding reduced detection precision caused as its light emitting devices vary in forward voltage. The present invention in the first embodiment provides light emitting module 100 configured to output current Ic having a binary value (of Ic1 or 0) depending on whether organic EL panel 10 normally operates, and whether an illumination apparatus configured of a plurality of light emitting modules 100 has a faulty light emitting module can be detected without an effect of variation in forward voltage and hence with precision.

Furthermore, the present invention in the first embodiment allows adjacent light emitting modules 100 to have current terminals P5 and P6, respectively, coupled together to allow current Ic output from each light emitting module 100 to be collected together on a single wiring and thus output to detection resistance 210. As a result, an illumination apparatus allowing a fault to be detected with high precision can be constructed with a small number of wirings.

Configuration of Circuit of Light Emitting Module

Hereinafter, what circuit configuration threshold value detection circuit 60 and VI conversion circuit 70 have and how they operate will specifically be described.

Figure 4:
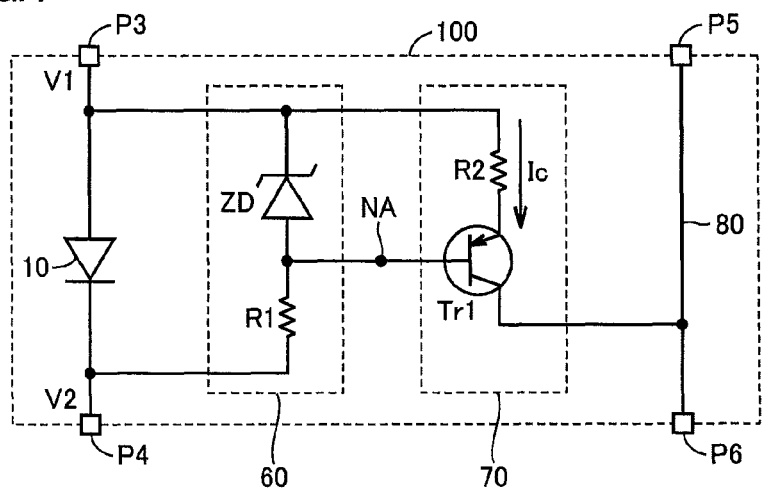
FIG. 4 shows a circuit in configuration of the light emitting module shown in FIG. 2.

FIG. 4 shows a circuit in configuration of light emitting module 100 shown in FIG. 2.

With reference to FIG. 4, threshold value detection circuit 60 is configured as a circuit that is formed of a Zener diode ZD and a resistor R1 connected in series and is connected to organic EL panel 10 in parallel. Zener diode ZD has a negative electrode connected to the positive electrode of organic EL panel 10 and has a positive electrode connected to resistor R1. Zener diode ZD and resistor R1 are connected by a connection terminal, which configures an output terminal of threshold value detection circuit 60, which corresponds in the figure to a node NA.

VI conversion circuit 70 includes a PNP transistor Tr1 and a resistor R2. PNP transistor Tr1 has an emitter connected via resistor R2 to the positive electrode of organic EL panel 10, a collector connected via current carrying wire 80 to current terminal P6, and a base connected to the output terminal of threshold value detection circuit 60 (or node NA).

As forward voltage Vf applied to organic EL panel 10 increases, a reverse voltage applied to Zener diode ZD increases. Once the reverse voltage has exceeded a breakdown voltage, a current passing through Zener diode ZD from the negative electrode to the positive electrode (or a reverse current) rapidly increases. Once a breakdown phenomenon has occurred, Zener diode ZD assumes a fixed value in voltage (i.e., breakdown voltage) regardless of what magnitude the reverse current has.

In the first embodiment, Zener diode ZD has threshold value Vth as its breakdown voltage. Accordingly, Zener diode ZD has a substantially fixed value (i.e., threshold value Vth) in voltage if the reverse current varies. Thus, threshold value detection circuit 60 outputs constant voltage of VA=V1−Vth at its output terminal (or node NA).

Figure 5:
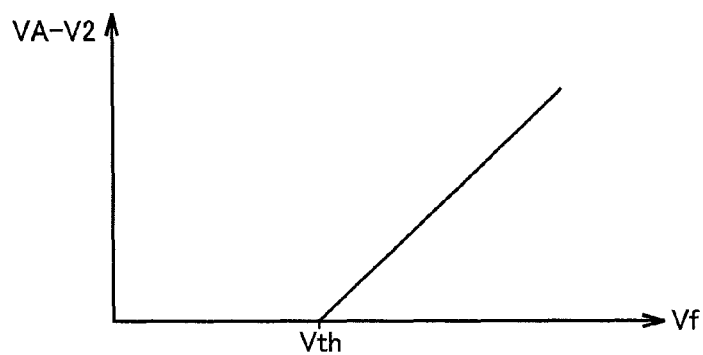
FIG. 5 illustrates how a threshold value detection circuit and a VI conversion circuit operate.
Figure 5:
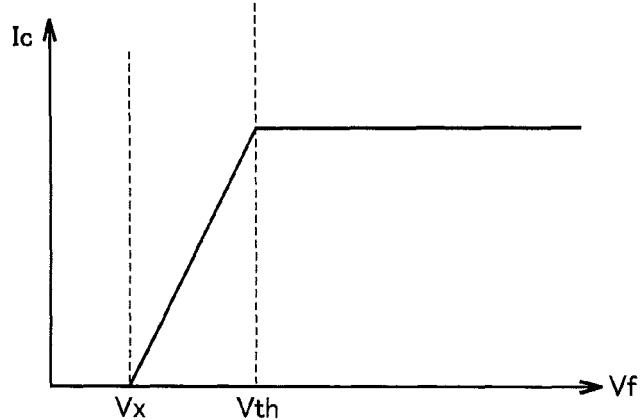

FIG. 5 is used to specifically describe how threshold value detection circuit 60 and VI conversion circuit 70 operate.

FIG. 5(a) represents a relationship between forward voltage Vf applied to organic EL panel 10 and a voltage VA−V2 between the output terminal (or node NA) and the negative electrode of organic EL panel 10. With reference to FIG. 5(a), when forward voltage Vf is lower than threshold value Vth, Zener diode ZD has no current passing therethrough, and accordingly, voltage VA−V2 equals zero. Once forward voltage Vf has reached threshold value Vth, Zener diode ZD breaks down and the reverse current passes therethrough, and accordingly, voltage VA−V2 equals a voltage drop in resistor R1. In other words, voltage VA−V2 increases as the reverse current increases.

In VI conversion circuit 70, a relationship as shown in FIG. 5(b) arises between forward voltage Vf and current Ic. Voltage V1−VA is applied to PNP transistor Tr1 between the base and emitter. Once PNP transistor Tr1 has turned on, a collector current flows. This collector current serves as current Ic output from VI conversion circuit 70.

With reference to FIG. 5(b), when forward voltage Vf is lower than threshold value Vth, voltage VA equals V2, and accordingly, PNP transistor Tr1 has a base-emitter voltage VBE equal to forward voltage Vf, i.e., VBE=Vf.

When PNP transistor Tr1 turns on with base-emitter voltage VBE of Vx for the sake of illustration, then, for forward voltage Vf lower than voltage Vx, PNP transistor Tr1 is not turned on, and accordingly, current Ic does not flow, and Ic equals 0. Note that voltage Vx is lower than threshold value Vth, and it is approximately 0.6 V, for example.

Once forward voltage Vf has exceeded voltage Vx, PNP transistor Tr1 is turned on and collector current Ic flows. Collector current Ic increases as forward voltage Vf increases.

Furthermore, once forward voltage Vf has reached threshold value Vth, Zener diode ZD breaks down and Zener diode ZD has Voltage V1−VA fixed to threshold value Vth. This in turn also fixes base-emitter voltage VBE to threshold value Vth, and collector current Ic also has a fixed value. Collector current Ic at the time can be represented by the following expression (1):

$$Ic=(V1-VA-Vx)/R2=(Vth-Vx)/R2 \qquad (1),$$

wherein R2 represents a value in resistance of resistor R2. In other words, the value in resistance of resistor R2 can be adjusted to adjust the value of current Ic. For example, for threshold value Vth=3 V and voltage Vx=0.6 V, current Ic=0.1 mA can be obtained via resistor R2 simply having a value in resistance set to 24 kΩ.

Ten light emitting modules 100, each as shown in FIG. 4, are connected in series to configure an illumination apparatus similarly as shown in FIG. 3 for the sake of illustration. If a single light emitting module 100 has forward voltage Vf in a range in voltage of 3 V to 5 V, the illumination apparatus will have an uppermost light emitting module 100 with power supply terminal P3 having voltage V1 in a range in voltage of 30 V to 50 V. When 10 light emitting modules 100 have one thereof with a short circuit fault, power supply terminal P3 has voltage V1 with its range in voltage varied to a range of 27 V to 45 V.

The range in voltage of 30 V to 50 V provided when 10 light emitting modules 100 all normally operate and that of 27 V to 45 V provided when 10 light emitting modules 100 have one thereof with a short circuit fault partially overlap. Thus, whether the plurality of light emitting modules 100 configuring the illumination apparatus normally operate cannot be determined from the magnitude of voltage V1 of power supply terminal P3. In the above example, preventing the range in voltage provided when the plurality of light emitting modules 100 all normally operate and that provided when the plurality of light emitting modules 100 have one thereof with a short circuit fault from partially overlapping entails limiting the number of series-connected light emitting modules 100 to at most two. This necessitates fault detection circuit 200 for every two light emitting modules 100, and hence a larger circuit configuration.

In the first embodiment, in contrast, a normal light emitting module 100 outputs a constant current (e.g., current Ic=0.1 mA), and if detection resistance 210 (see FIG. 3) has a value in resistance of 5 kΩ, and 10 light emitting modules 100 all normally operate, then detection resistance 210 develops a voltage of 5 V (=10 light emitting modules×0.1 mA×5 kΩ). In contrast, if 10 light emitting modules 100 have one faulty light emitting module, then detection resistance 210 develops a voltage of 4.5 V (=9 light emitting modules×0.1 mA×5 kΩ). Accordingly, fault detection circuit 200 can easily find from the voltage of detection resistance 210 whether 10 light emitting modules 100 normally operate.

Furthermore in the first embodiment threshold value detection circuit 60 and VI conversion circuit 70 are configured with elements (i.e., Zener diode ZD and PNP transistor Tr1), respectively, powered by the voltage of the positive electrode of organic EL panel 10 and thus driven, and the circuits thus do not require an external power supply to drive the circuits. This allows a simple configuration to be used to detect whether light emitting module 100 is faulty.

Second Embodiment

Figure 6:
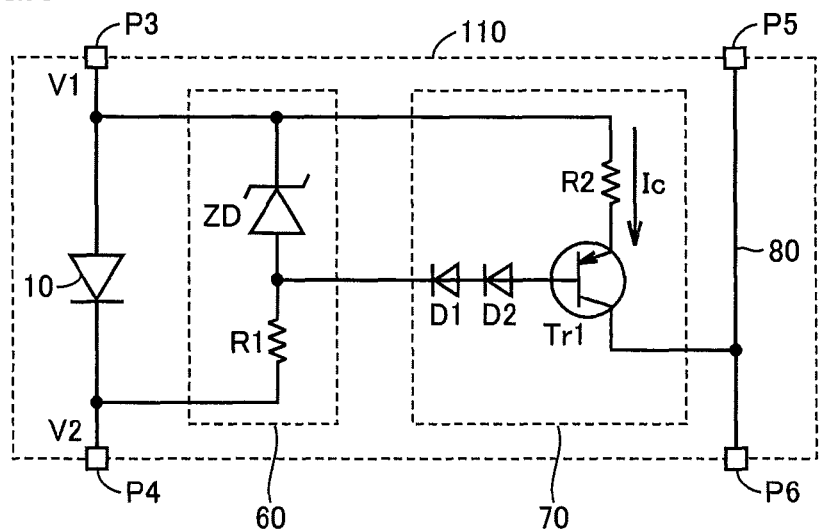
FIG. 6 schematically shows a circuit in configuration of a light emitting module according to a second embodiment of the present invention.

FIG. 6 schematically shows a circuit in configuration of a light emitting module 110 according to a second embodiment of the present invention.

With reference to FIG. 6, when light emitting module 110 according to the second embodiment is compared with light emitting module 100 according to the first embodiment as shown in FIG. 4, the former further includes a cascaded, plurality of stages of diodes D1, D2.

The plurality of stages of diodes D1, D2 are connected between the output terminal of threshold value detection circuit 60 (or node NA) and the base of PNP transistor Tr1. The plurality of stages of diodes D1, D2 have a function to develop a prescribed potential difference between the output terminal (or node NA) and the base of PNP transistor Tr1. How many stages of diodes are cascaded can be adjusted depending on a potential difference desired.

Light emitting module 100 according to the first embodiment as shown in FIG. 4 has PNP transistor Tr1 with a Vf-Ic characteristic (see FIG. 5(b)), and accordingly, once forward voltage Vf has exceeded voltage Vx, collector current Ic will flow (i.e., Ic>0) even if forward voltage Vf is still below threshold value Vth. When organic EL panel 10 has a short circuit fault, forward voltage Vf equals 0, and collector current Ic does not flow. Before organic EL panel 10 completely has the short circuit fault, however, there is a possibility that forward voltage Vf is larger than 0. Once forward voltage Vf has exceeded voltage Vx, collector current Ic flows (i.e., Ic>0), and an erroneous decision may be made that light emitting module 100 normally operates.

In the second embodiment such a disadvantage is avoided by using a plurality of stages of diodes D1, D2 to develop a potential difference between the output terminal of threshold value detection circuit 60 and the base of PNP transistor Tr1. For example when voltage per diode is set to 0.6 V, then in FIG. 6 a potential difference of approximately 1.2 V can be developed.

Figure 7:
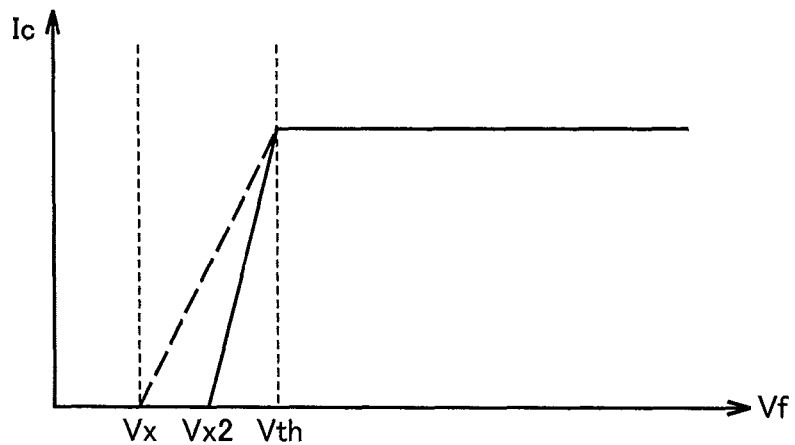
FIG. 7 shows in the second embodiment what relationship VI conversion circuit has between forward voltage Vf and current Ic.

This allows PNP transistor Tr1 to turn on with base-emitter voltage VBE of voltage Vx plus the voltage of the plurality of stages of diodes D1, D2. FIG. 7 shows in the second embodiment what relationship VI conversion circuit 70 has between forward voltage Vf and current Ic. With reference to FIG. 7, once forward voltage Vf has exceeded a voltage Vx2, Vx2 being larger than Vx, PNP transistor Tr1 is turned on and collector current Ic flows. Voltage Vx2 corresponds to a value of voltage Vx plus the voltage of the plurality of stages of diodes D1, D2. Once forward voltage Vf has reached threshold value Vth, collector current Ic has a fixed value.

FIG. 7 also shows by a broken line the relationship between forward voltage Vf and current Ic in VI conversion circuit 70 according to the first embodiment. When the relationship indicated by the broken line is compared with that in the third embodiment, the latter indicates no collector current Ic flowing for forward voltage Vf below voltage Vx2 (i.e., Ic=0). This can prevent erroneously determining from collector current Ic that a state which is had before a short circuit fault is completely had is the normal state.

Note that voltage Vx2 represented in FIG. 7 can be adjusted by adjusting the number of stages of diodes cascaded. Voltage Vx2 can be brought to be close to threshold value Vth by adjusting the number of stages of diodes to also detect that a state which is had before a short circuit fault is completely had is a faulty state. This allows a fault to be detected with increased precision.

Third Embodiment

Figure 8:
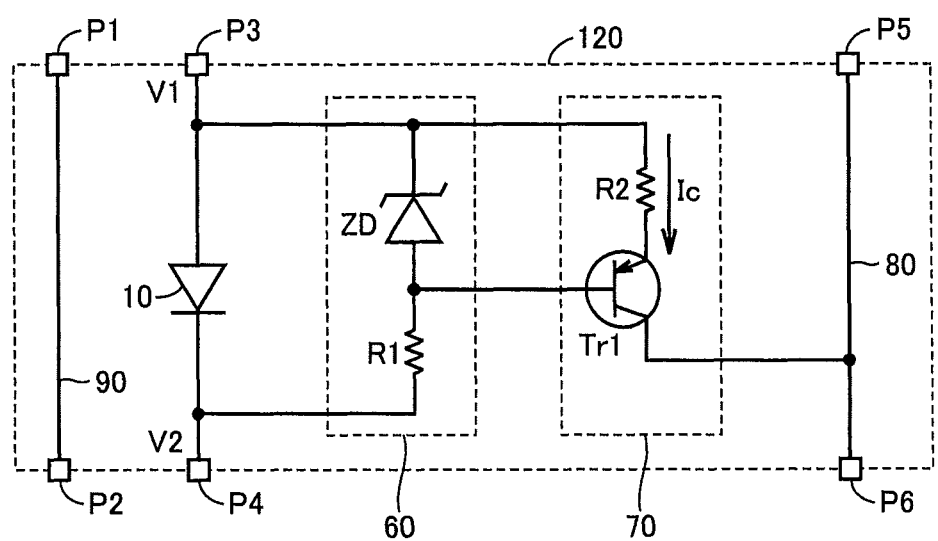
FIG. 8 schematically shows a circuit in configuration of a light emitting module according to a third embodiment of the present invention.

FIG. 8 schematically shows a circuit in configuration of a light emitting module 120 according to a third embodiment of the present invention.

With reference to FIG. 8, when light emitting module 120 according to the third embodiment is compared with light emitting module 100 according to the first embodiment as shown in FIG. 4, the former further includes terminals P1, P2 and a connecting wire 90 connecting terminals P1 and P2 together.

Figure 9:
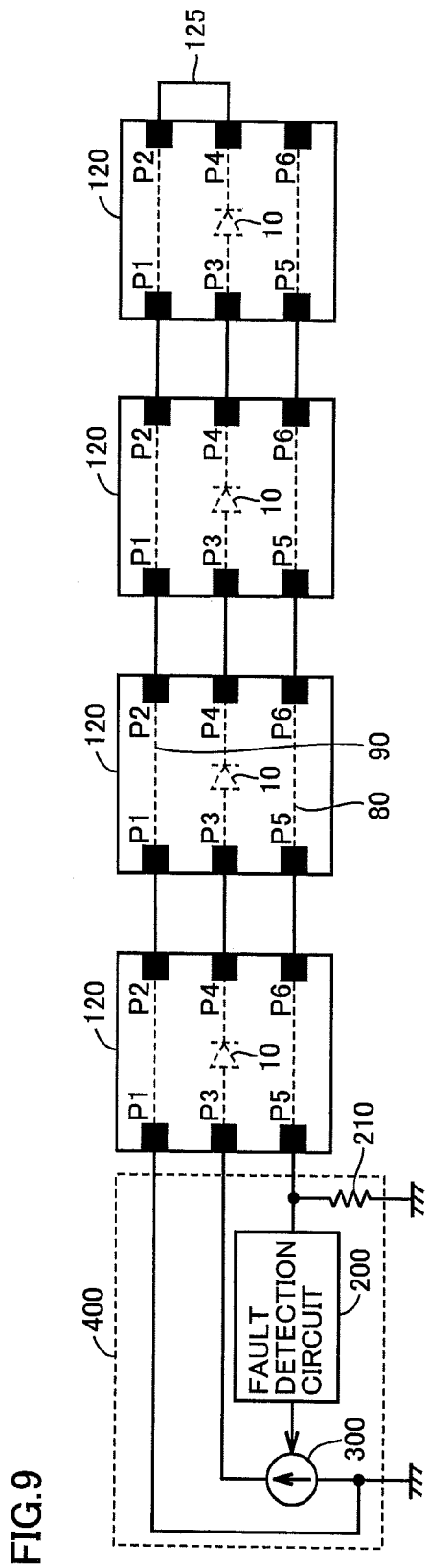
FIG. 9 schematically shows a configuration of an illumination apparatus configured using the light emitting module shown in FIG. 8.

Light emitting module 120 is provided with terminals P1-P6 to ensure that when a plurality of light emitting modules 120 are connected in series they are each electrically connected to an adjacent one thereof. FIG. 9 schematically shows a configuration of an illumination apparatus configured using light emitting module 120 shown in FIG. 8.

With reference to FIG. 9, the illumination apparatus is configured of a plurality of (e.g., four) light emitting modules 120 and a drive circuit 400 for supplying the plurality of light emitting modules 120 with a current. FIG. 9 shows the plurality of light emitting modules 120 each seen at a back surface thereof, i.e., in a rear view. In other words, circuit board 40 (see FIG. 1) and terminals P1-P6 provided on circuit board 40 are shown.

The plurality of light emitting modules 120 are wired together and thus connected in series. More specifically, one light emitting module 120 and another, adjacent light emitting module 120 have power supply terminals P3 and P4, respectively, wired together. The leftmost light emitting module 120 has power supply terminal P3 connected to constant current source 300 internal to drive circuit 400.

Furthermore, one light emitting module 120 and the other, adjacent light emitting module 120 have current terminals P6 and P5, respectively, wired together. This allows light emitting modules 120 to have their respective internal current carrying wires 80 interconnected. The leftmost light emitting module 120 has current terminal P5 connected to fault detection circuit 200 internal to drive circuit 400. Fault detection circuit 200 detects a voltage developed in detection resistance 210 connected between current terminal P5 and a ground voltage.

Furthermore, one light emitting module 120 and the other, adjacent light emitting module 120 have terminals P1 and P2, respectively, wired together. This allows light emitting modules 120 to have their respective internal connecting wires 90 interconnected. The rightmost light emitting module 120 has terminal P2 and power supply terminal P4 bridged by a jumper wire 125. Furthermore, the leftmost light emitting module 120 has terminal P1 connected to a ground voltage.

When constant current source 300 supplies a constant current, the constant current passes through the plurality of light emitting modules 120 and in each light emitting module 120 organic EL panel 10 receives the current and thus emits light. The rightmost light emitting module 120 organic EL panel 10 outputs a current which is in turn returned via power supply terminal P4 and terminal P2 through jumper wire 125 that bridges the terminals to connecting wire 90. The current is returned via each light emitting module 120 through connecting wire 90 to drive circuit 400, and then therethrough flows to the ground voltage.

The third embodiment thus provides light emitting module 120 with terminals P1, P2 and connecting wire 90 and also provides jumper wire 125 to allow a path to be formed between constant current source 300 and a plurality of light emitting modules 120 to return a current supplied to a plurality of organic EL panels 10. In other words, light emitting modules 120 having their respective terminals wired together can be connected to drive circuit 400 to allow the illumination apparatus to be wired in a simple configuration.

Fourth Embodiment

Figure 10:
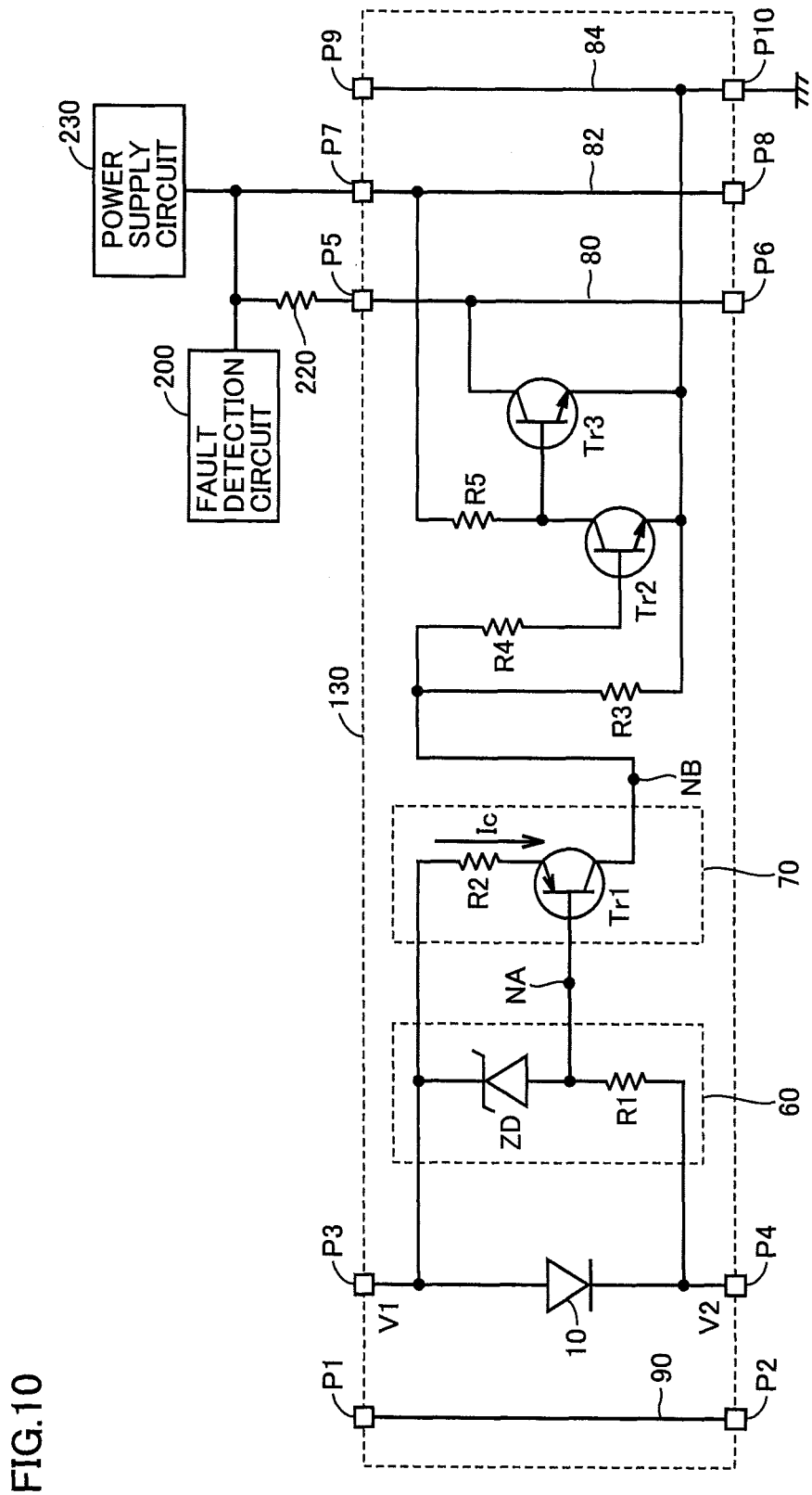
FIG. 10 schematically shows a circuit in configuration of a light emitting module according to a fourth embodiment of the present invention.

FIG. 10 schematically shows a circuit in configuration of a light emitting module 130 according to a fourth embodiment of the present invention.

With reference to FIG. 10, when light emitting module 130 according to the fourth embodiment is compared with light emitting module 100 according to the first embodiment as shown in FIG. 4, the former further includes NPN transistors Tr2, Tr3, resistors R3-R5, and terminals P7-P10.

NPN transistor Tr2 has a base connected via resistor R4 to VI conversion circuit 70 at an output node (in the figure, a node NB), a collector connected via resistor R5 to terminal P7, and an emitter connected to terminal P10. Resistor R3 is connected between the output terminal of VI conversion circuit 70 (or node NB) and the emitter of NPN transistor Tr2.

Note that terminal P7 is connected to a power supply circuit 230 external to light emitting module 130 and configures an external power supply terminal receiving power supply voltage from power supply circuit 230. Terminal P8 is connected to terminal P7 by an external power supply wire 82 and configures an external power supply terminal.

Furthermore, terminal P10 is connected to a ground voltage and configures a grounding terminal. Terminal P9 is connected to terminal P9 by a grounding wire 84 and configures a grounding terminal. In other words, NPN transistor Tr2 has its emitter grounded.

NPN transistor Tr3 has a base connected to a connection terminal connecting resistor R5 and NPN transistor Tr2, a collector connected to current terminal P6, and an emitter connected to grounding terminal P10. In other words, NPN transistor Tr3 has the collector connected to current terminal P6 and the emitter grounded, i.e., is an open-collector transistor.

External to light emitting module 130 are provided power supply circuit 230, fault detection circuit 200, and a pull-up resistor 220. Power supply circuit 230 supplies light emitting module 130 via external power supply terminal P7 with power supply voltage, which is set for example to +5 V. Light emitting module 130 has current terminal P5 connected via pull-up resistor 220 to power supply circuit 230 and fault detection circuit 200.

As has previously been described in the first embodiment, when light emitting module 130 has organic EL panel 10 normally operating, VI conversion circuit 70 passes constant current Ic=Ic1 through PNP transistor Tr1. In contrast, when organic EL panel 10 has a short circuit fault, VI conversion circuit 70 passes collector current Ic=0 through PNP transistor Tr1. VI conversion circuit 70 thus outputs current Ic which is in turn passed through resistor R3 and thus converted into voltage. Resistor R4 is a base current limiting resistor for limiting a current input to NPN transistor Tr3 at the base.

For current Ic=Ic1, i.e., when light emitting module 130 normally operates, the voltage converted by resistor R3 is received between the base and the emitter and a base current flows, and NPN transistor Tr3 thus turns on. Once NPN transistor Tr3 has turned on, a collector current will flow from external power supply terminal P7 toward grounding terminal P10. At the time, NPN transistor Tr3 does not have a base current passing therethrough and is accordingly turned off. When NPN transistor Tr3 is turned off, current terminal P5 has its voltage pulled up by pull-up resistor 220 to external power supply voltage (of +5 V) and input to fault detection circuit 200.

In contrast, for current Ic=0, i.e., when light emitting module 130 is faulty, NPN transistor Tr2 does not have a base current passing therethrough, and is accordingly turned off. As NPN transistor Tr2 is turned off, NPN transistor Tr3 has a base current passing therethrough via resistor R5. NPN transistor Tr3 is thus turned on. Once NPN transistor Tr3 has been turned on, current terminal P5 attains a ground voltage. Accordingly, fault detection circuit 200 receives the ground voltage.

As described above, in the fourth embodiment, when light emitting module 130 normally operates, fault detection circuit 200 receives external power supply voltage (of +5 V). When light emitting module 130 is faulty, fault detection circuit 200 receives ground voltage. The voltage input into fault detection circuit 200 has a voltage level allowing a microcomputer's input port to be directly connected thereto. This allows fault detection circuit 200 to have a simple configuration.

Figure 11:
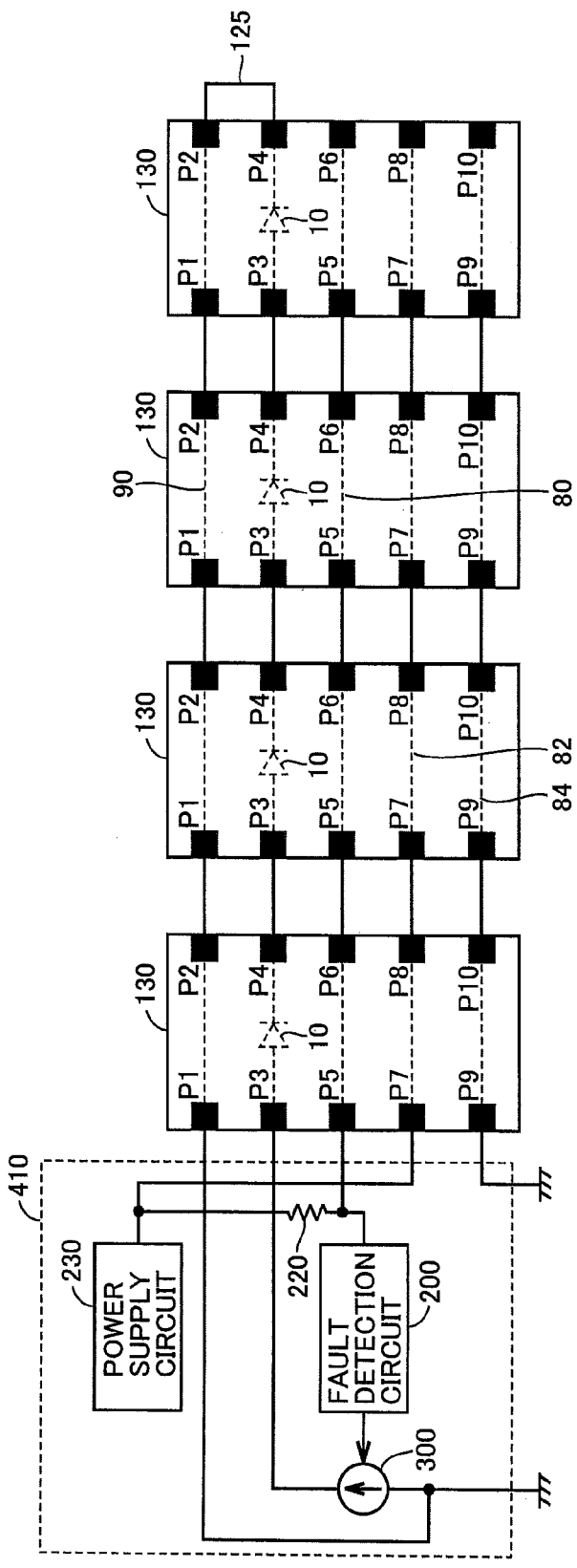
FIG. 11 schematically shows a configuration of an illumination apparatus configured using the light emitting module shown in FIG. 10.

FIG. 11 schematically shows a configuration of an illumination apparatus configured using light emitting module 130 shown in FIG. 10.

With reference to FIG. 11, the illumination apparatus is configured of a plurality of (e.g., four) light emitting modules 130 and a drive circuit 410 for supplying the plurality of light emitting modules 130 with a current. FIG. 11 shows the plurality of light emitting modules 130 each seen at a back surface thereof, i.e., in a rear view. In other words, circuit board 40 (see FIG. 1) and terminals P1-P10 provided on circuit board 40 are shown.

The plurality of light emitting modules 130 are wired together and thus connected in series. Adjacent light emitting modules 130 have their respective terminals P1-P4 wired and thus connected in the same configuration as the illumination apparatus shown in FIG. 9.

Furthermore, one light emitting module 130 and another, adjacent light emitting module 130 have current terminals P5 and P6, respectively, wired together. The leftmost light emitting module 130 has current terminal P5 connected via pull-up resistor 220 internal to drive circuit 410 to power supply circuit 230, and also connected to fault detection circuit 200. Fault detection circuit 200 detects a voltage developed at current terminal P5.

Furthermore, one light emitting module 130 and the other, adjacent light emitting module 130 have external power supply terminals P7 and P8, respectively, wired together. This allows light emitting modules 130 to have their respective external power supply wires 82 interconnected. Furthermore, the leftmost light emitting module 130 has external power supply terminal P7 connected to power supply circuit 230.

Furthermore, one light emitting module 130 and the other, adjacent light emitting module 130 have grounding terminals P9 and P10, respectively, wired together. This allows light emitting modules 130 to have their respective internal grounding wires 84 interconnected. Furthermore, the leftmost light emitting module 130 has grounding terminal P9 connected to a ground voltage.

In the FIG. 11 illumination apparatus, as well as the FIG. 9 illumination apparatus, when constant current source 300 supplies a constant current, the constant current passes through the plurality of light emitting modules 130, and the current is returned at the rightmost light emitting module 130 via power supply terminal P4 and terminal P2 through jumper wire 125 that bridges the terminals to connecting wire 90. The current is returned via each light emitting module 120 through connecting wire 90 to drive circuit 410, and then therethrough flows to the ground voltage.

When the plurality of light emitting modules 130 all normally operate, the leftmost light emitting module 130 has current terminal P5 pulled up by pull-up resistor 220 to an external power supply voltage (of +5 V). Fault detection circuit 200 determines from the voltage of current terminal P5 that the plurality of light emitting modules 130 all normally operate.

In contrast, when the plurality of light emitting modules 130 have at least one thereof with a fault, the leftmost light emitting module 130 current terminal P5 attains the ground voltage. Fault detection circuit 200 determines from the voltage of current terminal P5 that the plurality of light emitting modules 130 have at least one thereof with a fault.

Note that the first to fourth embodiments have been described with an organic EL panel as a representative example of a light emitting device applied to the present illumination apparatus and light emitting module. The present invention is, however, not limited as such and may be applied to other than the illumination apparatus that employs the organic EL panel. More specifically, the present invention is applicable to any illumination apparatus that includes a plurality of light emitting devices connected in series. For example, the present invention is also applicable to an illumination apparatus that employs an LED.

It should be understood that the embodiments disclosed herein have been described for the purpose of illustration only and in a non-restrictive manner in any respect. The scope of the present invention is defined by the terms of the claims, rather than the description above, and is intended to include any modifications within the meaning and scope equivalent to the terms of the claims.

REFERENCE SIGNS LIST

10: organic EL panel; 12: positive electrode; 14: organic layer; 16: negative electrode; 20: transparent substrate; 22: sealing substrate; 24: adhesive layer; 30: casing; 32: connecting electrode; 40: circuit board; 60: threshold value detection circuit; 70: VI conversion circuit; 80: current carrying wire; 82: external power supply wire; 84: grounding wire; 90: connecting wire; 100, 110, 120, 130: light emitting module; 125: jumper wire; 200: fault detection circuit; 210: detection resistance; 220: pull-up resistor; 230: power supply circuit; 300 constant current source; 400, 410: drive circuit; D1, D2: diode; Tr1: PNP transistor; Tr2, Tr3: NPN transistor; ZD: Zener diode.

The invention claimed is:

1. An illumination apparatus comprising:
   a plurality of light emitting modules connected in series;
   a constant current source configured to supply a current to the plurality of light emitting modules;
   a fault detection circuit configured to detect that the plurality of light emitting modules have at least one thereof with a short circuit fault,
   the plurality of light emitting modules each including:
      a light emitting device having an anode and a cathode;
      a threshold value detection circuit comprising:
         a first resistor having a first terminal and a second terminal;
         a Zener diode having an anode and a cathode;
         wherein the first terminal of the first resistor is connected to the cathode of the light emitting device and the second terminal of the first resistor is connected to the anode of the Zener diode; and
         wherein the cathode of the Zener diode is connected to the anode of the light emitting device;

wherein the threshold value detection circuit comprises the Zener diode and the first resistor connected in series and is connected to the light emitting device in parallel; and a voltage/current conversion circuit comprising:
a second resistor having a first terminal and a second terminal; and
a transistor having an emitter, a collector, and a base;
wherein the first terminal of the second resistor is connected to the cathode of the Zener diode and the anode of the light emitting device;
wherein the second terminal of the second resistor is connected to the emitter of the transistor;
wherein the collector of the transistor is connected to a current terminal for outputting a current externally from the light emitting module;
wherein the base of the transistor is either directly connected to a connection terminal connecting the anode of the Zener diode and the second terminal of the first resistor, or connected to the connection terminal through a diode; and
wherein the threshold value detection circuit is configured to output a constant voltage when the light emitting device has a normal state, whereas when the light emitting device has a short circuit fault, the threshold value detection circuit is configured to output a voltage equal to zero;
wherein the voltage/current conversion circuit is configured to output a constant current when the voltage/current conversion circuit receives the constant voltage from the threshold value detection circuit, whereas when the voltage/current conversion circuit receives the voltage equal to zero, the voltage/current conversion circuit is configured to output a current equal to zero;
wherein the fault detection unit is configured to detect whether the plurality of light emitting modules have a short circuit fault based on a total value of the constant current output from each the light emitting module;
wherein the fault detection unit is configured to control the constant current source so as to stop current supply when the fault detection unit detects that the plurality of light emitting modules have a short circuit fault.

2. A light emitting module comprising:
a light emitting device emitting having an anode and a cathode;
a threshold value detection circuit comprising:
a first resistor having a first terminal and a second terminal;
a Zener diode having an anode and a cathode;
wherein the first terminal of the first resistor is connected to the cathode of the light emitting device and the second terminal of the first resistor is connected to the anode of the Zener diode; and
wherein the cathode of the Zener diode is connected to the anode of the light emitting device;
wherein the threshold value detection circuit comprises the Zener diode and the first resistor connected in series and is connected to the light emitting device in parallel; and
a voltage/current conversion circuit comprising:
a second resistor having a first terminal and a second terminal; and
a first transistor having an emitter, a collector, and a base;
wherein the first terminal of the second resistor is connected to the cathode of the Zener diode and the anode of the light emitting device;
wherein the second terminal of the second resistor is connected to the emitter of the first transistor;
wherein the base of the first transistor is either directly connected to a connection terminal connecting the anode of the Zener diode and the second terminal of the first resistor, or connected to the connection terminal through a diode;
wherein the voltage/current conversion circuit is configured to output a constant current when the light emitting device has a normal state, whereas when the light emitting device has a short circuit fault, the voltage/current conversion circuit is configured to output a current equal to zero;
wherein the light emitting module further comprising:
a second transistor having a collector connected to a power supply terminal receiving a power supply voltage, an emitter connected to a grounding terminal receiving a ground voltage, and a base connected to the collector of the first transistor;
a third transistor being an open-collector transistor having a collector connected to a current terminal, and an emitter connected to the grounding terminal, and a base connected to the collector of the second transistor;
wherein the third transistor is configured to output a power supply voltage level to the current terminal when the voltage/current conversion circuit outputs the constant current, whereas when the voltage/current conversion circuit outputs the current equal to zero, the third transistor is configured to output a ground level to the current terminal.

* * * * *